United States Patent
Wu et al.

(10) Patent No.: US 10,157,780 B2
(45) Date of Patent: Dec. 18, 2018

(54) METHOD OF FORMING A DEVICE HAVING A DOPING LAYER AND DEVICE FORMED

(71) Applicant: TAIWAN SEMICONDUCTOR MANUFACTURING COMPANY, LTD., Hsinchu (TW)

(72) Inventors: Chii-Ming Wu, Taipei (TW); Cheng-Ta Wu, Shueishang Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 15/403,463

(22) Filed: Jan. 11, 2017

(65) Prior Publication Data

US 2018/0151419 A1    May 31, 2018

Related U.S. Application Data

(60) Provisional application No. 62/427,577, filed on Nov. 29, 2016.

(51) Int. Cl.
| H01L 21/768 | (2006.01) |
| H01L 29/66 | (2006.01) |
| H01L 23/535 | (2006.01) |
| H01L 21/3115 | (2006.01) |

(52) U.S. Cl.
CPC .... *H01L 21/76822* (2013.01); *H01L 21/3115* (2013.01); *H01L 21/76805* (2013.01); *H01L 21/76895* (2013.01); *H01L 23/535* (2013.01); *H01L 29/665* (2013.01); *H01L 29/66636* (2013.01)

(58) Field of Classification Search
CPC .. H01L 21/76895; H01L 21/76802–21/76817; H01L 21/76822; H01L 21/76828; H01L 29/66568–29/66598; H01L 21/225–21/2258; H01L 21/221
See application file for complete search history.

(56) References Cited

U.S. PATENT DOCUMENTS

| 5,811,283 A * | 9/1998 | Sun ........................ H01L 21/84 257/E21.651 |
| 6,096,599 A * | 8/2000 | Kepler ................ H01L 21/2257 257/E21.151 |
| 2002/0037622 A1* | 3/2002 | Chan ................. H01L 21/76802 438/301 |
| 2008/0122121 A1* | 5/2008 | Suda ................. H01L 21/02118 257/784 |
| 2009/0050972 A1* | 2/2009 | Lindsay .......... H01L 21/823807 257/368 |
| 2012/0088345 A1* | 4/2012 | Chen ................. H01L 21/28518 438/301 |

(Continued)

*Primary Examiner* — Xinning(Tom) Niu
*Assistant Examiner* — Sean P Hagan
(74) *Attorney, Agent, or Firm* — Hauptman Ham, LLP

(57) ABSTRACT

A method of making a device includes forming an opening in a dielectric layer to expose a conductive region in a substrate. The method further includes depositing a conformal layer of dopant material along sidewalls of the opening and along a top surface of the dielectric layer. The method further includes diffusing the dopant from the conformal layer of dopant material into the dielectric layer using an anneal process.

20 Claims, 5 Drawing Sheets

(56) References Cited

U.S. PATENT DOCUMENTS

2014/0145251 A1* 5/2014 Favennec .......... H01L 21/76224
                                                                                257/291
2016/0365274 A1* 12/2016 Choi ................. H01L 21/76825

* cited by examiner

METHOD OF FORMING A DEVICE HAVING A DOPING LAYER AND DEVICE FORMED

BACKGROUND

As technology nodes decrease, parasitic capacitance and contact resistance for contact plugs becomes more difficult to control. In larger node technologies, borophosphosilicate glass (BPSG) or phosphosilicate glass (PSG) was used as an interlayer dielectric (ILD) layer material. Smaller technology nodes use flowable silicon dioxide ($SiO_2$) as the ILD layer material. A dielectric value of the ILD layer material determines an amount of parasitic capacitance for conductive components embedded within the ILD layer.

In some approaches, the flowable $SiO_2$ is doped using an in-situ process. For example dopants were added during a deposition or epitaxial process in order to reduce the dielectric value of the flowable $SiO_2$. In some approaches, the flowable SiO2 is doped by implanting dopants into an already formed ILD layer to reduce the dielectric value.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
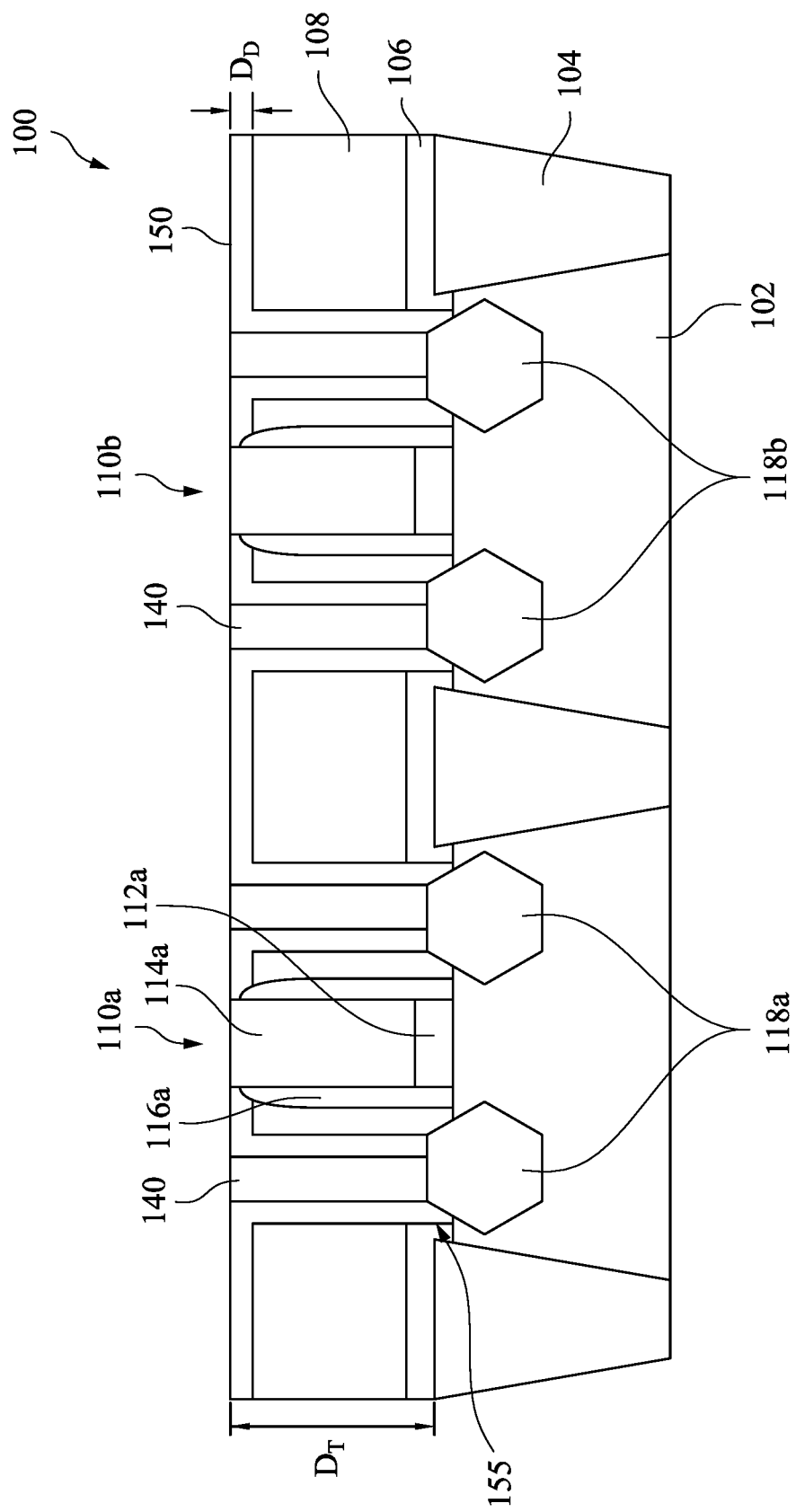
FIG. 1 is a cross-sectional view of a device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Parasitic capacitance and contact resistance impact how a device performs as part of an integrated circuit (IC). As parasitic capacitance or contact resistance increases, the performance of the device is degraded due to decreased speed for signals traveling along conductive elements, such as contact plugs. Parasitic capacitance is able to be reduced by decreasing a k-value of a dielectric material in which the conductive element is embedded. Contact resistance is able to be reduced by increasing conductivity at an interface between the conductive element and the gate or source/drain (S/D) region.

Introducing dopants into the dielectric material helps to decrease the k-value of the dielectric material and increase conductivity at an interface between a gate or S/D region and the conductive element. In some instances, the dopants include n-type or p-type dopants, such as phosphorous or boron.

In some approaches, a flowable $SiO_2$ material is used as the dielectric material, for example in an ILD layer. However, flowable $SiO_2$ is difficult to dope using in-situ doping or implantation processes. In-situ doping reduces a speed of the formation process of the dielectric material. This reduced speed reduces throughput of a manufacturing process. Implantation processes use photoresist materials to control a depth and location of dopant implantation. These photoresist materials are more difficult to form as technology nodes decrease, which increases the risk of defects within the implantation process.

In order to improve the throughput of the manufacturing process and reduce the risk of defects introduced by an implantation process, a device is manufactured by depositing a conformal dopant layer onto the device, including into openings for forming embedded conductive elements; then annealing the device to drive the dopants into the dielectric material. The dopants help to reduce the k-value in the dielectric material, which decreases the parasitic capacitance. The dopants also help to improve contact resistance at an interface between the conductive element and the gate or S/D region. In some embodiments, the annealing process is an independent annealing process. In some embodiments, the annealing process is combined with a silicidation (or salicidation) process.

Introducing the dopants through the use of the conformal dopant layer helps to ensure that dopants are located along an entirety of the opening for embedding the conductive element. Other processes, such as implantation, have a difficult time achieving a uniform dopant concentration in the dielectric material near the S/D regions because of the high aspect ratio of the opening. This lack of uniformity in the dopant concentration results in a higher k-value of the dielectric material near the S/D regions and more parasitic capacitance in comparison to the use of the conformal layer approach.

FIG. 1 is a cross sectional view of a device 100 in accordance with some embodiments. Device 100 includes a substrate 102. A plurality of isolation features 104 are within substrate 102. A contact etch stop layer (CESL) 106 extends over substrate 102 and isolation features 104. A dielectric layer 108 is over CESL 106. A first transistor 110a is over substrate 102 between adjacent isolation features 104. First transistor 110a includes a gate dielectric layer 112a on substrate 102; a gate electrode layer 114a over the gate dielectric layer; and a spacer 116a between dielectric layer 108 and the gate dielectric layer and the gate electrode layer.

First transistor 110a also includes source/drain (S/D) regions 118a at least partially in substrate 102 on opposite sides of gate electrode layer 114a. Device 100 includes a second transistor 110b, which has similar elements as first transistor 110a. In comparison with first transistor 110a, second transistor 110b has S/D regions 118b which have an opposite doping type from S/D regions 118a. Contact plugs 140 extend through dielectric layer 108 and CESL 106 to electrically connect to S/D regions 118a and S/D regions 118b. A doped region 150 is in dielectric layer 108. Doped region 150 has a depth $D_D$, which is less than a total depth $D_T$ of dielectric layer 108 and CESL 106. A region 155 of CESL 106 adjacent to S/D regions 118a and S/D regions 118b includes a thickness of doped region 150 which is substantially uniform with a thickness of the doped region near a surface of dielectric layer 108 farthest from substrate 102.

Device 100 is a pair of transistors. In some embodiments, the transistors are planar type transistors, such as complementary metal-oxide-semiconductor (CMOS) transistors. In some embodiments, the transistors are three-dimensional transistors, such as fin field effect transistors (FinFETs) or gate all around (GAA) transistors. In some embodiments, device 100 includes components other than transistors, such as capacitors, resistor, inductors or other suitable components. One of ordinary skill in the art would understand how to use of a conformal dopant layer to adjust a parasitic capacitance and contact resistance for forming connections to contact regions for these devices and the like.

In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 102 is a formed from an ingot. In some embodiments, substrate 102 is formed by forming a layer of substrate material over another structure. In some embodiments, substrate 102 is formed by an epitaxial growing process or another suitable formation process.

Isolation features 104 are shallow trench isolation (STI) features. Isolation features 104 are used to provide electrical separation between different components of devices, e.g., first transistor 110a and second transistor 110b. In some embodiments, isolation features 104 are deep trench isolation (DTI) features. In some embodiments, isolation features 104 are formed by removing a portion of substrate 102 to create a recess. The recess is then filled with a dielectric material such as $SiO_2$. In some embodiments, isolation features 104 are formed by a local oxidation of silicon (LOCOS) process. Isolation features 104 protrude above a top surface of substrate 102. In some embodiments, isolation features 104 have a top surface substantially co-planar with a top surface of substrate 102.

CESL 106 helps to protect substrate 102 during an etching process for forming openings in dielectric layer 108. CESL 106 is a dielectric material having a different etch selectivity from dielectric layer 108. In some embodiments, CESL 106 includes silicon nitride, silicon dioxide, silicon oxynitride, silicon carbide or another suitable dielectric material. In some embodiments, CESL 106 is formed by a deposition process such as, chemical vapor deposition (CVD), high density CVD (HDCVD), ALD, or another suitable deposition process. CESL 106 extends up sidewalls of spacers 116a (and spacers for second transistor 110b). In some embodiments, CESL 106 does not extend up sidewalls 116a; and has a substantially constant thickness along the top surface of substrate 102.

Dielectric layer 108 helps to electrically separate conductive components of first transistor 110a from conductive components of second transistor 110b, including contact plugs 140. Dielectric layer 108 has a different composition from CESL 106. Dielectric layer 108 is an ILD layer. In some embodiments, dielectric layer is a layer other than an ILD layer. In some embodiments, dielectric layer 108 is a low-k dielectric material. A low-k dielectric material has a dielectric constant below silicon dioxide. In some embodiments, dielectric layer 108 includes flowable $SiO_2$. In some embodiments, dielectric layer 108 includes BPSG, PSG or another suitable dielectric material.

First transistor 110a has an opposite dopant-type from second transistor 110b. In some embodiments, first transistor 110a has a same dopant-type as second transistor 110b. In some embodiments, first transistor 110a and second transistor 110b are MOS transistors. In some embodiments, first transistor 110a and second transistor 110b are FinFET transistors. In some embodiments, first transistor 110a is a different style of transistor from second transistor 110b, e.g., first transistor 110a is a planar MOS transistor and second transistor 110b is a FinFET transistor. In some embodiments, device 100 includes more than two transistors.

Components of second transistor 110b are similar to components of first transistor 110a and the following discussion of components for the first transistor are also applicable to the second transistor. One of ordinary skill would understand that materials for components for first transistor 110a and second transistor 110b are independently selectable from the materials discussed below.

Gate dielectric layer 112a electrically separates gate electrode layer 114a from a channel region of substrate 102. In some embodiments, gate dielectric layer 112a includes silicon dioxide. In some embodiments, gate dielectric layer 112a includes a high-k dielectric material. A high-k dielectric material has a dielectric constant (k) higher than the dielectric constant of silicon dioxide. In some embodiments, k is greater than 3.9. In some embodiments, k is greater than 8.0. In some embodiments, gate dielectric layer 112a is formed by a deposition process, such as CVD, HDCVD, atomic layer deposition (ALD) or another suitable deposition process.

Gate electrode layer 114a is configured to receive a voltage for selectively adjusting conductivity of the channel region of substrate 102. Gate electrode layer 114a includes a conductive material. In some embodiments, gate electrode layer 114a includes a metallic material, a conductive polymer, or another suitable conductive material. In some embodiments, gate electrode layer 114a includes a work function layer to adjust a work function of first transistor 110a. In some embodiments, gate electrode layer 114a is formed by a deposition process, such as PVD, CVD, HDCVD, or another suitable deposition process. In some embodiments, gate electrode layer 114a is a dummy gate material. In some embodiments, more than one deposition process is utilized in formation of gate electrode layer 114a in order to adjust a work function of the gate electrode layer. The dummy gate material is replaceable to form an operational transistor. In some embodiments where the structure of first transistor 110a is used to form a resistor, the dummy gate material of gate electrode layer 114a is not replaced.

Spacer 116a helps to form lightly doped drain (LDD) regions at opposite sides of gate dielectric layer 112a and gate electrode layer 114a to reduce the risk of hot carrier injection. In some embodiments, spacer 116a includes silicon nitride, silicon oxynitride, silicon dioxide, SiCN, SiOCN, SiOCR (R: CH3, C2H5, C3H7, . . . ) or another suitable dielectric material. In some embodiments, spacer 116a is formed using a combination of a deposition process and an etching process. In some embodiments, the deposition process includes CVD, HDCVD, ALD or another suitable deposition process. In some embodiments, the etching process includes an anisotropic etching process. In some embodiments, spacer 116a directly contacts dielectric layer 108. In some embodiments, spacer 116a is separated from dielectric layer 108 by CESL 106.

S/D regions 118a are regions within substrate 102 which have a higher conductivity than the substrate. S/D regions 118a extend above the top surface of substrate 102. In some embodiments, S/D regions 118a have a top surface substantially co-planar with the top surface of substrate 102. In some embodiments, S/D regions 118a include an epitaxial material. In some embodiments, S/D regions 118a exert a stress on the channel region of substrate 102. S/D regions 118a include n-type dopants or p-type dopants. In some embodiments, S/D regions 118a include boron or phosphorous. In some embodiments, S/D regions 118a are formed by implanting dopants into substrate 102. In some embodiments, S/D regions 118a are formed by forming an opening in substrate 102 and filling the opening. In some embodiments, the opening is filled by epitaxially growing a germanium containing material, or another suitable material, in the opening. In some embodiments, the material in the opening is doped during a formation process. In some embodiments, the material in the opening is doped following the formation process.

S/D regions 118b have an opposite dopant type from S/D regions 118a. In some embodiments, S/D regions 118b and S/D regions 118a have a same dopant type. In some embodiments, a structure of S/D regions 118a is different from a structure of S/D regions 118b, e.g., a top surface of S/D regions 118a extends above the top surface of substrate 102 and a top surface of S/D regions 118b is substantially coplanar with the top surface of the substrate.

Contact plugs 140 provide electrical connections to S/D regions 118a and S/D regions 118b. Contact plugs 140 include a conductive material. In some embodiments, contact plugs 140 include copper, aluminum, tungsten, or another suitable conductive element. In some embodiments, contact plugs 140 are formed by a plating process, physical vapor deposition (PVD), sputtering, or another suitable formation process.

In some embodiments, a silicide (or salicide) layer is at an interface between contact plugs 140 and corresponding S/D regions of S/D regions 118a or S/D regions 118b. In some embodiments, the silicide layer includes titanium, nickel, tungsten, cobalt or another suitable silicide material. The silicide layer is formed by depositing a metallic layer over the S/D regions 118a and S/D regions 118b and annealing device 100 to diffuse the metallic layer into the silicon material of S/D regions 118a and S/D regions 118b.

Doped region 150 is in dielectric layer 108 and CESL 106. Depth $D_D$ of doped region 150 is substantially uniform along an entirety of doped region 150. The depth is measured from a closest surface of dielectric layer 108 or CESL 106 to a point where a concentration of dopants is substantially equal to a body of dielectric layer 108 or CESL 106. Doped region 150 helps to reduce a dielectric constant of dielectric layer 108 and CESL 106. In some embodiments, doped region 150 reduces the dielectric constant of dielectric layer and CESL 106 by about 0.05 to about 0.15. For example, in some embodiments, the k value of dielectric layer 108 is reduced from about 4.0 to about 3.9. Dielectric layer 108 also helps gather mobile ions to prevent electrical degradation of first transistor 110a and second transistor 110b.

In some embodiments, depth $D_D$ ranges from about 5 angstroms (Å) to about 300 Å. In some embodiments, depth $D_D$ ranges from about 20 Å to about 100 Å.

Doped region 150 includes either p-type dopants or n-type dopants. In some embodiments, doped region 150 includes phosphorous or boron. In some embodiments, a percentage of boron amongst dopants in doped region 150 for a p-type transistor is greater than about 90%. In some embodiments, a percentage of phosphorous amongst dopants in doped region 150 for an n-type transistor is greater than about 90%. In some embodiments, the concentration of dopants in the S/D regions in a top region of 118a or S/D regions 118b ranges from about 0.05% to about 2%. If the dopant concentration is too low, contact resistance is not sufficiently reduced to permit device 100 to function as designed, in some instances. If the dopant centration is too high, a risk of a short circuit between contact plug 140 and other conductive elements increases, in some instances.

Doped region 150 is formed by depositing a conformal layer of dopant material on device 100. The conformal layer extends over dielectric layer 108 and along sidewalls of openings in the dielectric layer and CESL 106 for receiving contact plugs 140. The conformal layer is formed prior to forming contact plugs. In some embodiments, the conformal layer is deposited by CVD, HDCVD, plasma doping, atomic layer deposition (ALD), or another suitable process. Device 100 is then annealed in order to drive dopants from the conformal layer into dielectric layer 108 and CESL 106. In some instances, the anneal process also drives dopants into S/D regions 118a and/or S/D regions 118b. In some instances, the anneal process also drives dopants into gate electrode layer 114a and the gate electrode layer of second transistor 110b. In some embodiments where gate electrode layer 114a is a dummy gate electrode, the dummy gate electrode is replaced by a gate replacement process and gate electrode layer 114a does not include dopants from doped region 150. In some embodiments, dopants from doped region 150 are removed from gate electrode layer 114a during a gate contact formation process, so device 100 does not include dopants from doped region 150 in gate electrode layer 114a. In some embodiments, dopants from doped region 150 are present in the silicide layer between contact plugs 140 and S/D regions 118a and S/D regions 118b.

In some embodiments, the anneal process for driving the dopants into dielectric layer 108 and CESL 106 to form doped region 150 is performed independent of an anneal process for forming the silicide layer. In some embodiments, the anneal process for forming doped region 150 is a same anneal process as that used to form the silicide layer. Using a single anneal process to form both doped region 150 and the silicide layer helps to reduce manufacturing cost and to reduce damage to other components of device 100. In some embodiments, the anneal process is a low temperature rapid thermal anneal (RTA), a laser anneal process, a flash anneal, a spike anneal process, a microsecond anneal process, or another suitable anneal process. In some embodiments, the anneal process temperature ranges from about 400° C. to about 600° C. If the anneal process temperature is too high then a risk of damage to components in device 100 increases, in some instances. If the anneal process temperature is too low the temperature is insufficient to drive dopants from the conformal layer into dielectric layer 108 and CESL 106 in order to form doped region 150, in some embodiments.

Figure 2:
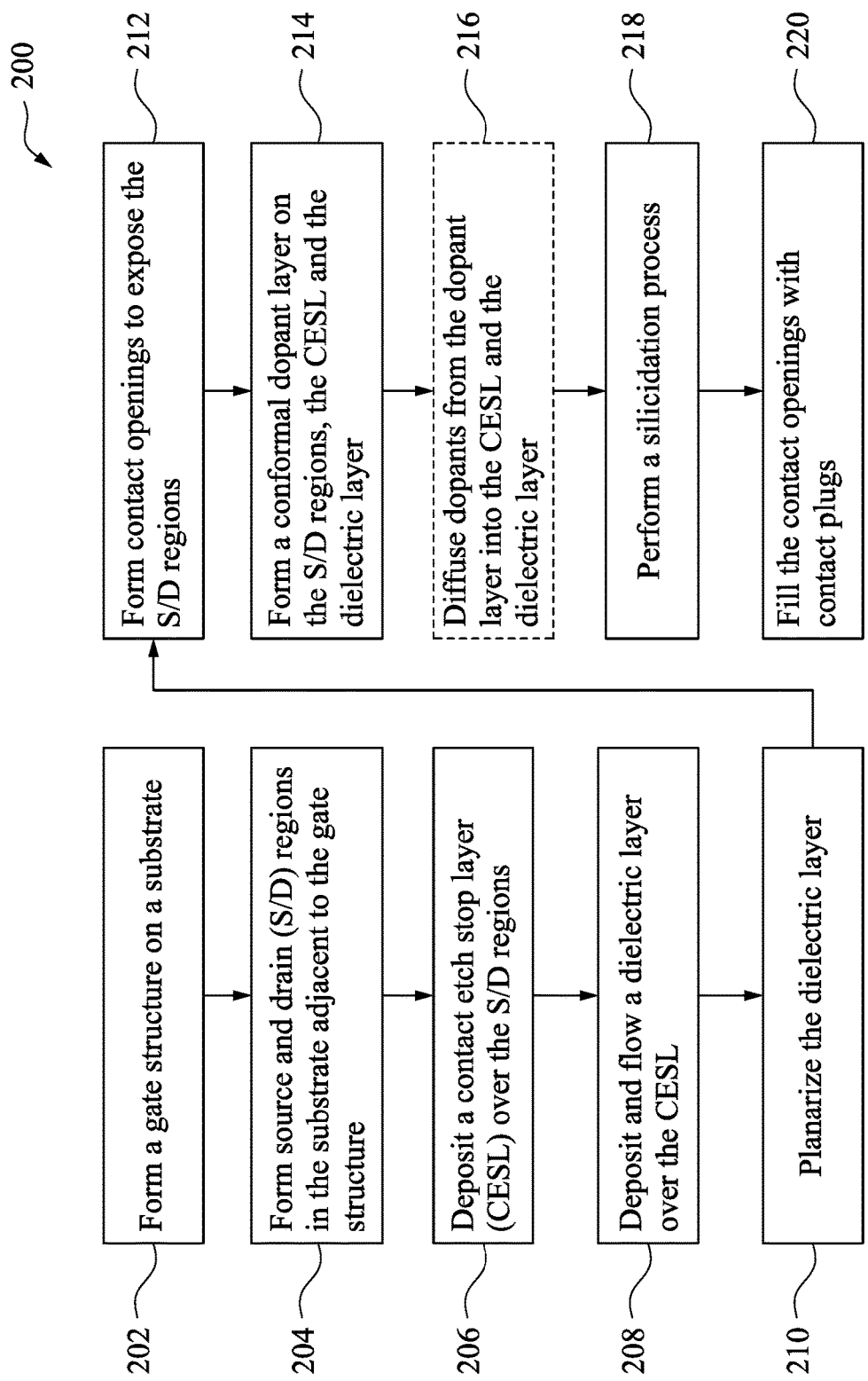
FIG. 2 is a flowchart of a method of making a device in accordance with some embodiments.

FIG. 2 is a flowchart of a method 200 of making a device in accordance with some embodiments. In operation 202, a gate structure is formed over a substrate. In some embodiments, the substrate is an epitaxial layer over another supporting structure. The gate structure includes a gate dielectric layer, a gate electrode layer and a spacer, e.g., gate dielectric layer 112a, gate electrode layer 114a, and spacer 116a (FIG. 1). In some embodiments, the gate structure is a dummy gate structure. In some embodiments, the gate structure is a functional gate. Isolation features are in the substrate in order to help electrically separate the gate structure from neighboring components of the device.

In some embodiments, the gate structure is formed through a series of deposition processes and etching processes. In some embodiments, the gate dielectric layer and the gate electrode layer are blanket deposited over the substrate. A photomask is then patterned over the layers and the layers are etched to form a gate stack. A material for the spacer is then deposited over the gate stack and etched to form the spacer. In some embodiments, multiple gate structures are formed in operation 202.

In operation 204, S/D regions are formed in the substrate adjacent to the gate structure. In some embodiments, the S/D regions, e.g., S/D regions 118a (FIG. 1), are formed by an implantation process. In some embodiments, the S/D regions are formed by removing a portion of the substrate to create recess; and filling the recesses with S/D material. In some embodiments, the S/D material include silicon, germanium, silicon germanium or another suitable material. In some embodiments, the recesses are filled using an epitaxial process. The S/D regions are doped by either in-situ doping or a doping process separate from the process for filling the recesses. In some embodiments, a top surface of the S/D regions is above a top surface of the substrate. In some embodiments, the top surface of S/D regions is substantially coplanar with the top surface of the substrate.

In operation 206, a contact etch stop layer (CESL) is deposited over the substrate. The CESL, e.g. CESL 106 (FIG. 1), is over the gate structure, the S/D regions and the substrate. The CESL includes a dielectric material. In some embodiments, the CESL includes silicon nitride, silicon oxynitride, silicon carbide, or another suitable material. In some embodiments, the CESL is formed by CVD, HDCVD, ALD or another suitable deposition process.

In operation 208, a dielectric layer is deposited and flowed over the CESL. The dielectric layer, e.g., dielectric layer 308 (FIG. 3A), extends over the gate structure, the S/D regions and the CESL. The dielectric layer includes flowable $SiO_2$. In some embodiments, the dielectric layer includes BPSG, PSG, or another suitable flowable $SiO_2$ material. A material of the dielectric layer is different from a material of the CESL. A top surface of the dielectric is above a top surface of the gate structure.

In operation 210, the dielectric layer is planarized. The dielectric layer is planarized to expose a top of the gate structure. The planarization process removes any portion of the CESL over the gate structure. In some embodiments, the planarization process removes a portion of the gate structure. In some embodiments, the planarization process is a chemical mechanical planarization (CMP) process. In some embodiments, the planarization process includes etching. In some embodiments, the planarization process including a combination of a CMP process and an etching process.

In operation 212, contact openings are formed in the dielectric layer and CESL to expose a portion of the S/D regions. The contact openings are spaced from the gate structure. In some embodiments, sidewalls of the contact openings are substantially perpendicular to the top surface of the substrate. In some embodiments, the contact openings have tapered sidewalls. In some embodiments, the contact openings are formed by an etching process. A photoresist is deposited over the dielectric layer and patterned to define a location of the contact openings. The dielectric layer is then etched using the pattern photomask. In some embodiments, the dielectric layer is etched using a wet etching process. In some embodiments, the dielectric layer is etched using a dry etching process. In some embodiments, a different etching process or etchant is used to remove portions of the dielectric layer and portions of the CESL. The photoresist layer is then removed by an ashing process. In some embodiments, a cleaning process is used to help with removal of residue material from the contact openings following the etching process.

In operation 214, a conformal dopant layer is deposited over the dielectric layer, in the contact opening, over the CESL, over the exposed portion of the S/D regions and over the top of the gate structure. A thickness of the conformal dopant layer is substantially constant over an entirety of the conformal dopant layer. The conformal layer lines an entirety of the contact openings including a portion of the contact opening extending through the CESL, e.g., at location 155 (FIG. 1). The conformal dopant layer includes boron or phosphorous. In some embodiments, the conformal dopant layer is deposited by CVD, HDCVD, ALD, plasma doping, or another suitable deposition process. A thickness of the conformal dopant layer ranges from about 0.5 nanometers (nm) to about 30 nm. In some embodiments, the deposition process implants the dopant slightly below a surface of the dielectric layer and the CESL.

In some embodiments, the conformal dopant layer includes phosphorous. In some embodiments, a deposition process for forming the dopant layer including phosphorous is conducted at a pressure ranging from about 4 milliTorr (mT) to about 20 mT. A phosphane ($PH_3$) gas is used to deposit the conformal dopant layer including phosphorous. A carrier gas, such as argon, helium, nitrogen gas, or another suitable carrier gas is used to help convey the phosphane to the surface of the dielectric layer and the CESL. In some embodiments, a bias is used to direct the phosphane and carrier gas to the surface of the dielectric layer and the CESL. In some embodiments, the bias ranges from about 200 electron volts (eV) to about 2000 eV. In some embodiments, no bias is applied during the deposition process.

In some embodiments, the conformal dopant layer includes boron. In some embodiments, a deposition process for forming the dopant layer including boron is conducted at a pressure ranging from about 4 mT to about 20 mT. A boron-containing gas, such as $B_2H_6$, is used to deposit the conformal dopant layer including boron. A carrier gas, such as argon, helium, nitrogen gas, or another suitable carrier gas is used to help convey the boron-containing gas to the surface of the dielectric layer and the CESL. In some embodiments, a bias is used to direct the boron-containing and carrier gas to the surface of the dielectric layer and the CESL. In some embodiments, the bias ranges from about 500 eV to about 3000 eV. In some embodiments, no bias is applied during the deposition process.

In optional operation 216, dopants from the conformal dopant layer are diffused into the dielectric layer, the CESL, the S/D regions and the gate structure. The dopants are diffused by an anneal process to form a doped region, e.g., doped region 150 (FIG. 1), in the dielectric layer and the CESL. A thickness of the doped region is substantially constant throughout the entirety of the doped region, including in the CESL adjacent to the S/D regions. In some embodiments, a temperature of the anneal process ranges from about 400° C. to about 600° C. If the temperature of the anneal process is too high, the anneal process will damage components of the device, in some instances. If the temperature of the anneal process is too low, the anneal process will not diffuse dopants from the conformal dopant layer into the dielectric layer and the CESL, in some instances. In some embodiments, the anneal process is a laser anneal, a spike anneal, a microsecond anneal, or another suitable anneal process. In some embodiments, operation 216 is omitted. Operation 216 is omitted if the anneal process used to form a silicide (or salicide) in the device is simultaneously used to diffuse the dopants into the dielectric layer and the CESL.

In operation 218, a silicide layer is formed between the conductive material and the S/D regions. The silicide layer is formed using an anneal process, which causes reaction between a metallic layer and silicon in the S/D regions. In some embodiments, a temperature of the anneal process ranges from about 400° C. to about 600° C. If the temperature of the anneal process is too high, a risk of damage to components of the device increases, in some embodiments. If the temperature of the anneal process is too low, less than all of the metallic layer will be consumed by the reaction with the silicon in the S/D regions. In some embodiments, the anneal process includes a laser anneal, spike anneal, a microsecond anneal, or another suitable anneal process. In some embodiments, an anneal process of operation 220 is a same process as the anneal process of operation 216. In some embodiments, the anneal process of operation 220 is a different process as the anneal process of operation 216. In some embodiments, the temperature of the anneal process of operation 216 is a same temperature as the temperature of the anneal process of operation 220. In some embodiments, the temperature of the anneal process of operation 216 is different from the temperature of the anneal process of operation 220.

In some embodiments, operation 220 also diffuses dopants from conformal dopant layer into the dielectric layer and the CESL. Omitting operation 216 and using the anneal of operation 218 to form the silicide and diffuse the dopants into the dielectric layer and the CESL helps to reduce manufacturing time and manufacturing cost; and helps to reduce the risk of damage to components of the device by subjecting the components to fewer anneal processes.

In operation 220, a conductive material is formed in the contact openings. The conductive materials electrically contact S/D regions. In some embodiments, the conductive material includes copper, aluminum, tungsten, titanium, conductive polymer or another suitable conductive material. In some embodiments, the conductive material is formed in the contact openings using a sputtering process, PVD, CVD, ALD, plating or another suitable formation process. In some embodiments, a planarization process is used to remove excess conductive material outside of the contact holes. The filled contact holes form contact plugs, e.g., contact plugs 140 (FIG. 1), for electrical connection between the S/D regions and other components of the device.

In some embodiments, a metallic layer is formed over the conformal dopant layer over the exposed portions of the S/D regions prior to filling the contact opening with the conductive material. The metallic layer is used to form a silicide layer between the conductive material and the S/D regions. In some embodiments, the metallic layer includes titanium, nickel, cobalt, or another suitable metallic material. In some embodiments, the metallic layer is formed using PVD, sputtering, CVD, ALD, plating or another suitable process.

In some embodiments, additional operations are included in method 200. For example, in some embodiments, silicide layer is formed over the gate structure. In some embodiments, operations are omitted from method 200. For example, in some embodiments, operation 216 is omitted. In some embodiments, an order of operations of method 200 is changed. For example, in some embodiments, operation 220 occurs prior to operation 218. If operation 220 occurs before operation 218, then the metallic layer is deposited in the contact openings as described above, and the silicide is formed by an annealing process after filling the contact openings with the conductive material.

Figure 3A:
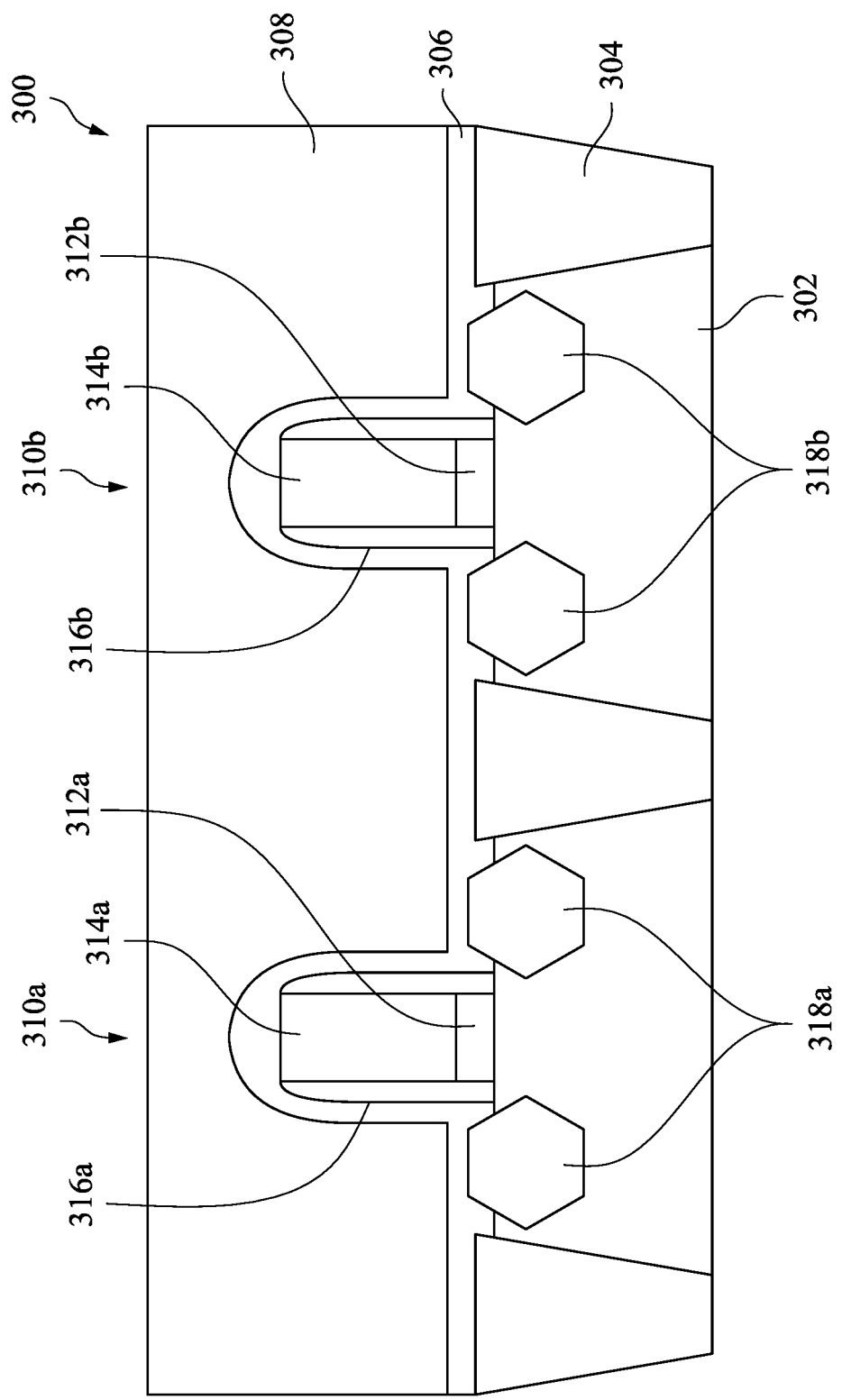
FIGS. 3A-3C are cross-sectional views of a device during different stages of production in accordance with some embodiments.

FIG. 3A is a cross-sectional view of a device 300 following deposition of a dielectric layer in accordance with some embodiments. Device 300 is similar to device 100 (FIG. 1); and similar elements have a same reference number increased by 200. In comparison with device 100, device 300 includes CESL 306 extending over a gate structure of first transistor 310a and second transistor 310b. Device 300 further includes dielectric layer 308 over CESL 306; and extending over the top of the gate structure of first transistor 310a and second transistor 310b. In some embodiments, device 300 is an intermediate device following operation 208 of method 200 (FIG. 2).

Figure 3B:
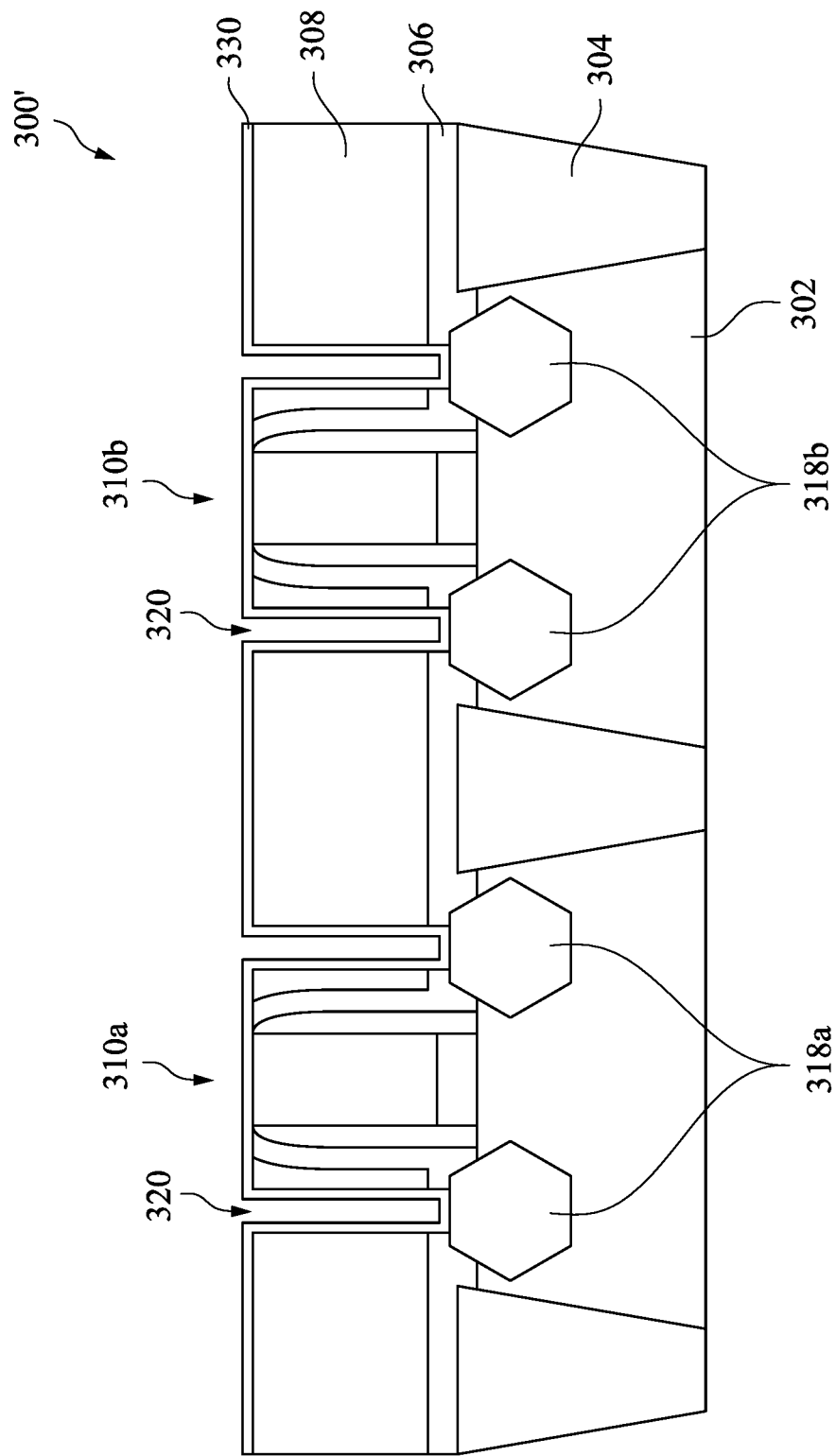

FIG. 3B is a cross-sectional view of device 300' following deposition of a conformal dopant layer over a dielectric layer and into contact openings in the dielectric layer according to some embodiments. Device 300' is similar to device 300 after additional processing; and same reference number reference to similar elements. A thickness of conformal dopant layer 330 is substantially constant along an entirety of the layer. Conformal dopant layer 330 extends along an entirety of sidewalls of contact openings 320, including along CESL 306 adjacent to S/D regions 318a and S/D regions 318b. By using conformal dopant layer 330 instead of an implantation process to form a doped region, e.g. doped region 150 (FIG. 1), parasitic capacitance of a final structure resulting from additional processing of device 300' is reduced. The reduction in parasitic capacitance is related to conformal dopant layer 330 extending along the entirety of the sidewalls of contact openings 320 in order to achieve a substantially uniform doped region. In some embodiments, device 300' is an intermediate device following operation 214 of method 200 (FIG. 2).

Figure 3C:
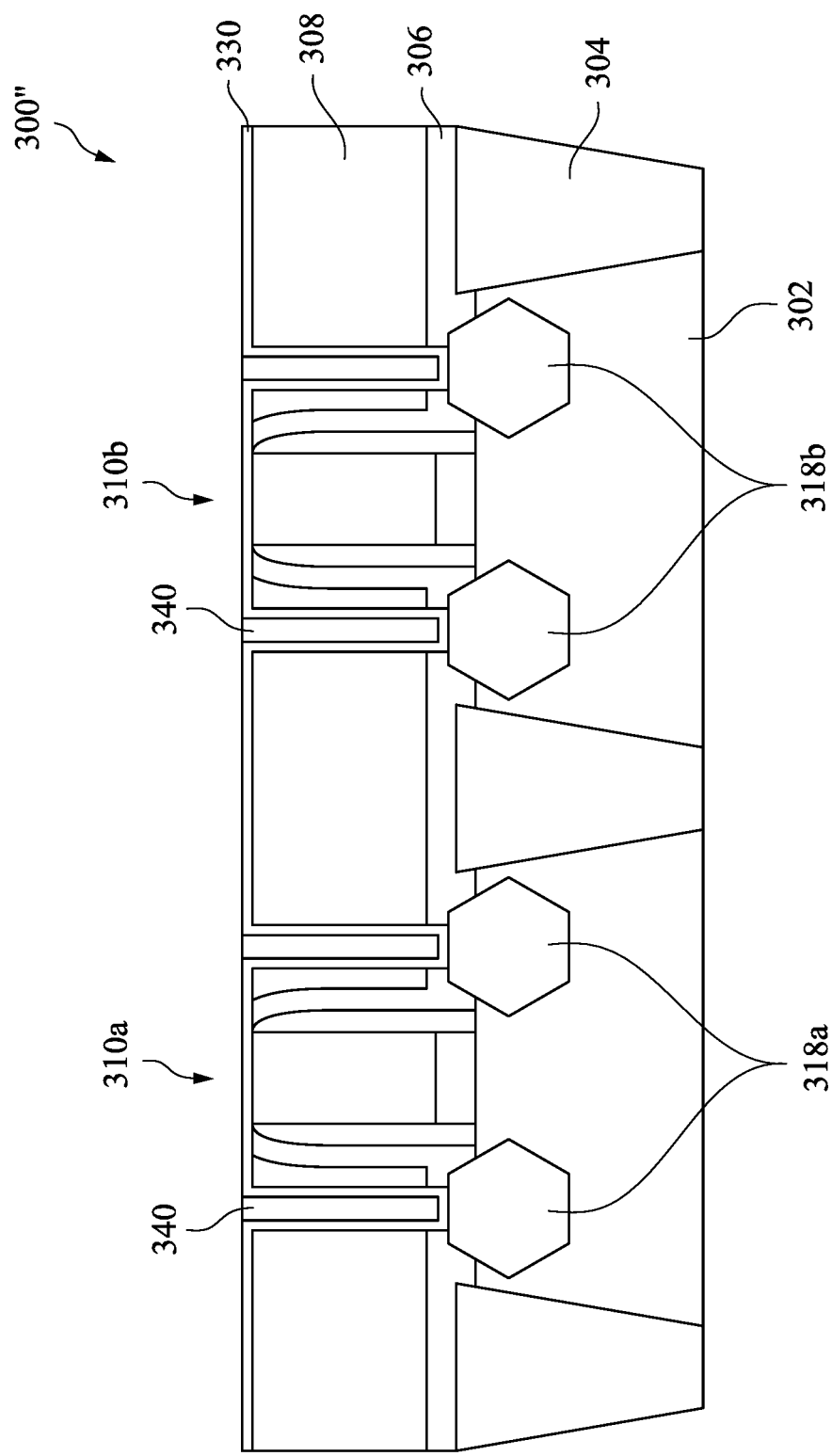

FIG. 3C is a cross-section view of device 300" following filling of contact openings with conductive material in accordance with some embodiments. Device 300" is similar to device 300' after additional processing; and same reference number reference to similar elements. Conductive material 340 is used to form contact plugs in a final structure following additional processing of device 300''. Conformal dopant layer 330 remains between conductive material 340 and S/D regions 318a and S/D regions 318b. Dopants from conformal dopant layer 330 have not been diffused into dielectric layer 308 or CESL 306 prior to formation of conductive material 340. In some embodiments, a metallic layer is between a bottom-most surface of conductive material 340 and conformal dopant layer 330. The metallic layer is usable to form a silicide material when the metallic layer reacts with silicon from S/D regions 318a and S/D regions 318b. In some embodiments, device 300'' is an intermediate device following operation 218 in method 200, where operation 216 is omitted (FIG. 2).

In comparison with some approaches, using a conformal dopant layer achieves a more uniform doped region in a dielectric layer and CESL of a device. This more uniform doped region helps to reduce parasitic capacitance and assist in the device functioning as designed. Other approaches have a non-uniformity at in the doped region near a bottom of a contact plug adjacent to the S/D regions. This non-uniformity results from difficulty in implanting ions near a bottom of the contact due to the high aspect ratio of the contact openings. As technology nodes continue to decrease the difficulty in implanting ions uniformly into the sidewalls of the contact plug will increase, as well. Using a conformal dopant layer for diffusing dopants into the sidewalls of the contact openings reduces the impact of the high aspect ratio of the contact openings in order to achieve a device which functions closer to the designed performance than other approaches.

One aspect of this description relates to a method of making a device. The method includes forming an opening in a dielectric layer to expose a conductive region in a substrate. The method further includes depositing a conformal layer of dopant material along sidewalls of the opening and along a top surface of the dielectric layer. The method further includes diffusing the dopant from the conformal layer of dopant material into the dielectric layer using an anneal process.

Another aspect of this description relates to a method of making a device. The method includes forming a gate structure over a substrate. The method further includes forming source/drain (S/D) regions in the substrate adjacent to the gate structure. The method further includes depositing a contact etch stop layer (CESL) over the substrate, the S/D regions and the gate structure. The method further includes depositing a dielectric layer over the CESL. The method further includes etching the dielectric layer and CESL to form a plurality of openings, wherein each opening of the plurality of openings exposes a portion of a corresponding S/D region of the S/D regions. The method further includes depositing a conformal dopant layer over the dielectric layer, wherein the conformal dopant layer covers an entirety of a sidewall of each opening of the plurality of openings. The method further includes filling the plurality of openings with a conductive material. The method further includes diffusing dopants from the conformal dopant layer into the dielectric layer and the CESL.

Still another aspect of this description relates a device includes a gate structure over a substrate. The device includes source/drain (S/D) regions in the substrate adjacent to the gate structure. The device includes a contact etch stop layer (CESL) over a portion of the S/D regions. The device includes a dielectric layer over the CESL. The device further includes a plurality of contact plugs extending through the dielectric layer and the CESL, wherein each contact plug of the plurality of contact plugs is electrically connected to a corresponding S/D region of the S/D regions. The device further includes a doped region in the dielectric layer and the CESL, wherein a depth of the doped region in the CESL from a surface of a closest contact plug of the plurality of contact plugs is substantially equal to a depth of the doped region in the dielectric layer from the surface of the closest contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a device, the method comprising:
    forming an opening in a dielectric layer to expose a conductive region in a substrate;
    depositing a conformal layer of dopant material along sidewalls of the opening and along a top surface of the dielectric layer; and
    diffusing the dopant from the conformal layer of dopant material into the dielectric layer using an anneal process.

2. The method of claim 1, further comprising filling the opening with a conductive material.

3. The method of claim 2, wherein diffusing the dopant from the conformal layer of dopant material into the dielectric layer is performed prior to filling the opening with the conductive material.

4. The method of claim 2, wherein diffusing the dopant from the conformal layer of dopant material into the dielectric layer is performed after filling the opening with the conductive material.

5. The method of claim 2, further comprising depositing a metallic layer over the conductive region prior to filling the opening with the conductive material.

6. The method of claim 1, further comprising growing the substrate over a support structure.

7. The method of claim 1, further comprising forming the conductive region in the substrate, wherein forming the conductive region comprises:
    forming a recess in the substrate; and
    growing the conductive region in the recess.

8. The method of claim 1, wherein depositing the conformal layer comprises depositing the conformal layer having a thickness ranging from about 0.5 nanometers (nm) to about 30 nm.

9. The method of claim 1, wherein depositing the conformal layer comprises depositing the conformal layer using chemical vapor deposition (CVD), high-density CVD (HD-CVD), atomic layer deposition (ALD), or plasma doping.

10. A method of making a device, the method comprising:
    forming a gate structure over a substrate;
    forming source/drain (S/D) regions in the substrate adjacent to the gate structure;
    depositing a contact etch stop layer (CESL) over the substrate, the S/D regions and the gate structure;
    depositing a dielectric layer over the CESL;

etching the dielectric layer and CESL to form a plurality of openings, wherein each opening of the plurality of openings exposes a portion of a corresponding S/D region of the S/D regions;

depositing a conformal dopant layer over the dielectric layer, wherein the conformal dopant layer covers an entirety of a sidewall of each opening of the plurality of openings;

filling the plurality of openings with a conductive material; and diffusing dopants from the conformal dopant layer into the dielectric layer and the CESL.

11. The method of claim 10, wherein diffusing the dopants into the dielectric layer and the CESL is performed prior to filling the plurality of openings with the conductive material.

12. The method of claim 10, wherein filling the plurality of openings with the conductive material is performed prior to diffusing the dopants into the dielectric layer and the CESL.

13. The method of claim 10, wherein diffusing the dopants into the dielectric layer and the CESL comprises forming a doped region, wherein a depth of the doped region in the dielectric layer from a sidewall of an adjacent opening of the plurality of openings is substantially equal to a depth of the doped region in the CESL from the sidewall of the adjacent opening.

14. The method of claim 10, wherein diffusing the dopants into the dielectric layer and the CESL comprises forming a doped region having a depth from a top surface of the dielectric layer, and a ratio of the depth of the doped region to a combined depth of the dielectric layer and the CESL ranges from about 5% to about 40%.

15. The method of claim 10, further comprising performing a silicidation process.

16. The method of claim 15, wherein performing the silicidation process occurs simultaneously with diffusing the dopants into the dielectric layer and the CESL.

17. The method of claim 10, wherein depositing the conformal dopant layer comprises depositing the conformal dopant layer over a top of the gate structure.

18. A method of making a device, the method comprising:
forming a gate structure over a substrate, wherein the substrate includes source/drain (S/D) regions on opposite sides of the gate structure;

depositing a dielectric layer over the gate structure and the substrate, wherein the dielectric layer covers the S/D regions;

forming an opening in the dielectric layer to expose at least one S/D region of the S/D regions;

depositing a conformal layer of dopant material along sidewalls of the opening and along a top surface of the dielectric layer;

filling a remaining portion of the opening with a conductive material; and diffusing the dopant from the conformal layer of dopant material into the dielectric layer using an anneal process.

19. The method of claim 18, wherein the diffusing of the dopant from the conformal layer of dopant material into the dielectric layer comprises forming a silicide using the at least one S/D region and the conductive material.

20. The method of claim 18, further comprising forming a silicide using the conductive material and the at least one S/D region, wherein the forming of the silicide occurs after the diffusing of the dopant from the conformal layer of dopant material into the dielectric layer.

* * * * *